(12) United States Patent
Thompson et al.

(10) Patent No.: US 6,919,468 B2
(45) Date of Patent: Jul. 19, 2005

(54) ASYMMETRIC GROUP 8 (VIII) METALLOCENE COMPOUNDS

(75) Inventors: David M. Thompson, Williamsville, NY (US); Cynthia A. Hoover, Grand, NY (US)

(73) Assignee: Praxair Technology, Inc., Danbury, CT (US)

( * ) Notice: Subject to any disclaimer, the term of this patent is extended or adjusted under 35 U.S.C. 154(b) by 0 days.

(21) Appl. No.: 10/686,254

(22) Filed: Oct. 16, 2003

(65) Prior Publication Data

US 2004/0171858 A1 Sep. 2, 2004

Related U.S. Application Data

(60) Provisional application No. 60/422,946, filed on Oct. 31, 2002, provisional application No. 60/422,947, filed on Oct. 31, 2002, provisional application No. 60/426,284, filed on Nov. 14, 2002, provisional application No. 60/427,461, filed on Nov. 18, 2002, provisional application No. 60/446,320, filed on Feb. 7, 2003, provisional application No. 60/453,718, filed on Apr. 18, 2003, provisional application No. 60/453,719, filed on Apr. 18, 2003, and provisional application No. 60/453,717, filed on Apr. 18, 2003.

(51) Int. Cl.$^7$ .......................... C07F 17/02; C23C 16/00
(52) U.S. Cl. ...................... 556/136; 556/143; 427/587; 427/593
(58) Field of Search ................................ 556/136, 143; 427/587, 593

(56) References Cited

U.S. PATENT DOCUMENTS 3,035,978 A * 5/1962 Moss et al. ................. 514/502
6,074,945 A 6/2000 Vaartstra et al. ............ 438/681
6,440,495 B1 8/2002 Wade et al. ................. 427/250
2002/0102826 A1 8/2002 Shirmamoto et al. ....... 438/575

OTHER PUBLICATIONS

Peck et al., "Chemical Vapor Deposition Of Novel Precursors For Advanced Capacitor Electrodes", *Electrochemical Society, Inc.*, published and presented on May 14, 2002.

* cited by examiner

*Primary Examiner*—Porfirio Nazario-Gonzalez
(74) *Attorney, Agent, or Firm*—Gerald L. Coon

(57) ABSTRACT

Asymmetric, disubstituted metallocene compounds have the general formula CpMCp' where M is a metal selected from the group consisting of Ru, Os and Fe; Cp is a first substituted cyclopentadienyl or indenyl moiety that includes at least one substituent group $D_1$; Cp' is a second substituted cyclopentadienyl or indenyl moiety that includes at least one substituent group $D_1'$. $D_1$ is different from $D_1'$. $D_1$ is X; $C_{a1}H_{b1}X_{c1}$; $C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom or nitro group; a1 is an integer between 2 and 8; b1 is an integer between 0 and 2(a1)+1−c1; c1 is an integer between 0 and 2(a1)+1−b1; b1+c1 is at least 1; a2 is an integer between 0 and 8; b2 is an integer between 0 and 2(a2)+1−c2; and c2 is an integer between 0 and 2(a2)+1−b2; and D1' is X; $C_{a1}H_{b1}X_{c1}$; $C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom or nitro group; a1 is an integer between 1 and 8; b1 is an integer between 0 and 2(a2)+1−cl; c1 is an integer between 0 and 2(a1)+1−b1; b1+c1 is at least 1; a2 is an integer between 0 and 8; b2 is an integer between 0 and 2(a2)+1−c2; and c2 is an integer between 0 and 2(a2)+1−b2. The compounds can be employed as precursors in film deposition processes.

21 Claims, 6 Drawing Sheets

ASYMMETRIC GROUP 8 (VIII) METALLOCENE COMPOUNDS

RELATED APPLICATIONS

This application claims the benefit of U.S. Provisional Application No. 60/422,946, filed Oct. 31, 2002; U.S. Provisional Application No. 60/422,947, filed Oct. 31, 2002; U.S. Provisional Application No. 60/426,284, filed Nov. 14, 2002; U.S. Provisional Application No. 60/427,461, filed Nov. 18, 2002; U.S. Provisional Application No. 60/446,320, filed Feb. 7, 2003; U.S. Provisional Application No. 60/453,718, filed Apr. 18, 2003; U.S. Provisional Application No. 60/453,719, filed Apr. 18, 2003; and U.S. Provisional Application No. 60/453,717, filed Apr. 18, 2003. The entire teachings of the above-referenced applications are incorporated herein by reference.

BACKGROUND OF THE INVENTION

Chemical vapor deposition (CVD) methods are employed to form films of material on substrates such as wafers or other surfaces during the manufacture or processing of semiconductors. In CVD, a CVD precursor, also known as a CVD chemical compound, is decomposed thermally, chemically, photochemically or by plasma activation, to form a thin film having a desired composition. For instance, a vapor phase CVD precursor can be contacted with a substrate that is heated to a temperature higher than the decomposition temperature of the precursor, to form a metal or metal oxide film on the substrate.

Thin films that include ruthenium (Ru), ruthenium oxide ($RuO_2$) or iron (Fe) have good electrical conductivity, high work function, are chemically and thermally stable, resistant to inter-layer chemical diffusion and are compatible with many dielectric substrate materials. Ru and $RuO_2$ films, for instance, have been investigated as film electrode material for semiconductor devices such as DRAM (Dynamic Random Access Memory) devices.

Bis(pentahaptocyclopentadienyl)ruthenium(ruthenocene) and the symmetrical, diethyl-substituted ruthenocene(1,1'-diethylruthenocene) have been investigated as possible precursors for forming ruthenium-based thin films by CVD techniques. These compounds have been prepared by several synthetic routes.

One existing method for forming ruthenocene includes the reaction of $RuCl_3 \cdot XH_2O$ with cyclopentadiene, in the presence of Zn, to produce ruthenocene, $ZnCl_2$ and HCl, as shown in FIG. 1A. A similar approach, using ethyl-substituted cyclopentadiene, has been employed to produce 1,1'-diethylruthenocene, as shown in FIG. 1B. Generally, yields obtained by this method are about 70%.

As shown in FIG. 1C, unsubstituted ruthenocene also has been prepared by the reaction of cyclopentadiene, chloro(cyclopentadienyl)bis(triphenylphosphine)ruthenium(II) and sodium hydride (NaH) in benzene. Chloro(cyclopentadienyl)bis(triphenylphosphine)ruthenium(II) precursor has been synthesized by reacting ruthenium trichloride and triphenylphosphine in ethanol.

Another method that has been investigated for the synthesis of ruthenocene includes the transmetallation reactions of a bis(alkylcyclopentadienyl)iron compound with $RuCl_3 \cdot XH_2O$ and results in the formation of low yield 1,1'-dialkylruthenocene, iron trichloride ($FeCl_3$) and difficult to separate iron species.

As seen in FIGS. 1A and 1B, these synthetic approaches include a one step addition of both cyclopentadienyl rings and thus are suitable for preparing unsubstituted ruthenocene or the symmetrically substituted 1,1'-diethylruthenocene.

Monosubstituted ruthenocene, e.g., 1-ethylruthenocene, is formed as an impurity during the synthesis of 1,1'-diethylruthenocene. Another monosubstituted ruthenocene, tert-butyl(cyclopentadienyl)(cyclopentadienyl)ruthenium has been prepared by reacting a heated mixture of bis(cyclopentadienyl)ruthenium, aluminum chloride and polyphosphoric acid, with tert-butyl alcohol, followed by distillation.

Both ruthenocene and 1,1'-diethylruthenocene have relatively low vapor pressure (less than 10 Torr at 100° C.). At room temperature, ruthenocene is a solid and 1,1'-diethylruthenocene is a liquid.

Generally, more volatile CVD precursors are preferred, as are precursors that are liquid at room temperature, rather than solid. In addition, desired CVD precursors also are heat decomposable and capable of producing uniform films under suitable CVD conditions.

Therefore, a need exists for developing new ruthenocenes that are liquid at room temperature and have relatively high vapor pressure and for exploring their potential as CVD precursors for film depositions. A need also exists for developing other Group 8 (VIII) metallocene compounds that can be used as CVD precursors for forming osmium- or iron-based films.

SUMMARY OF THE INVENTION

The invention generally is related to asymmetric Group 8 (VIII) metallocenes. More specifically, the invention is directed to a compound of the general formula CpMCp', where M is a metal selected from the group consisting of Ru, Os and Fe; Cp is a first substituted cyclopentadienyl or indenyl moiety that includes at least one substituent group $D_1$; and Cp' is a second substituted cyclopentadienyl or indenyl moiety that includes at least one substituent group $D_1'$.

The two groups, $D_1$ and $D_1'$, are different from each other and are independently selected.

$D_1$ can be:

X;

$C_{a1}H_{b1}X_{c1}$;

$C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom or a nitro ($NO_2$) group;

a1 is an integer from 2 to 8;

b1 is an integer from 0 to 2(a1)+1−c1;

c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

$D_1'$ can be:

X;

$C_{a1}H_{b1}X_{c1}$;

$C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom or $NO_2$;

a1 is an integer from 1 to 8;

b1 is an integer from 0 to 2(a1)+1−c1;

c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

One specific example of a metallocene compound of the invention is 1-methyl-1'-ethylruthenocene.

At least one of Cp or Cp' can include one or more additional substituents, e.g., $D_2$, $D_3$, $D_4$, $D_5$, $D_2'$, $D_3'$, $D_4'$, and $D_5'$.

The invention has several advantages. The compounds of the invention provide additional options and flexibility to existing methods for producing Ru-, Os-, or Fe-based thin films by CVD. Some of these compounds are liquid at room temperature. In addition, it has been found that 1-methyl-1'-ethylruthenocene has a higher vapor pressure than 1,1'-diethylruthenocene. Independent functionalization of each of the cyclopentadienyl rings in the compounds of the invention is believed to modify properties such as solubility, vapor pressure, decomposition, combustion and other reaction pathways, reduction/oxidation potentials, geometry, preferred orientations and electron density distribution through modification of the cyclopentadienyl rings. Functionalization of the cyclopentadienyl ring allows tailoring or optimization of the metallocene for a desired application.

DETAILED DESCRIPTION OF THE INVENTION

Figure 1A:
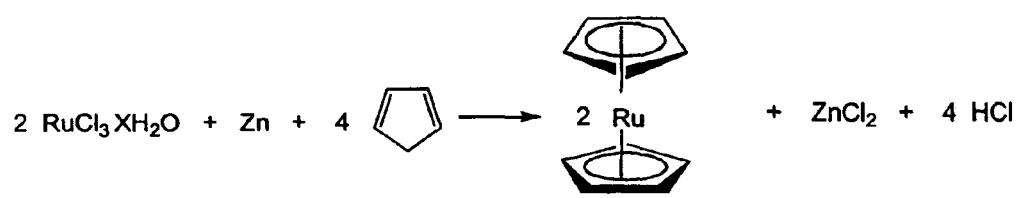
FIG. 1A depicts a prior art synthetic route for forming unsubstituted ruthenocene.
Figure 1B:
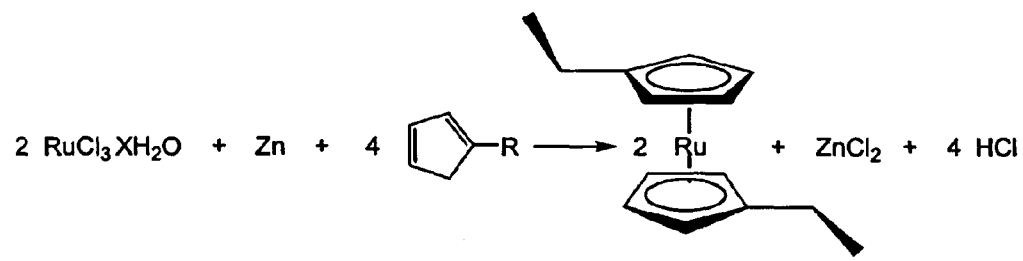
FIG. 1B depicts a prior art synthetic route for forming 1,1'-diethylruthenocene.
Figure 1C:
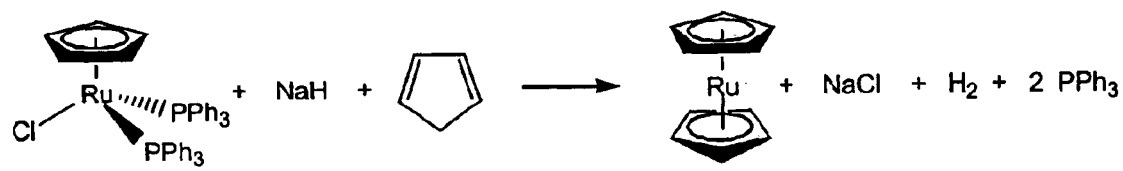
FIG. 1C depicts another prior art method that has been used to form unsubstituted ruthenocene.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

The invention generally relates to Group 8 (VIII) asymmetric metallocenes. As used herein, the term "metallocene" refers to an organometallic coordination compound, having a sandwich-type structure similar to that of ferrocene, in which a transition metal is believed to be π-bonded (electrons are moving in orbitals extending above and below the ring) to cyclic moieties. In the asymmetric metallocenes described herein, the cyclic moieties are cyclopentadienyl or indenyl. If all 5 carbon atoms in the cyclopentadienyl ring are bonding to the transition metal, cyclopentadienyl or indenyl (a cyclopentadienyl ring fused to a phenyl ring) moieties also can be described as $\eta^5$-coordinated moieties. Thus a complete description of ferrocene would be $(\eta^5\text{-}C_5H_5)_2Fe$.

Figure 2A:
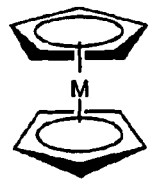
FIG. 2A shows the molecular formula of a prior art metallocene in a staggered conformation.
Figure 2B:
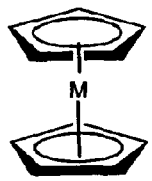
FIG. 2B shows the molecular formula of a prior art metallocene in an eclipsed conformation.

Shown in FIG. 2A is a staggered conformation of an unsubstituted metallocene, where M is a group 8 (VIII) metal, e.g., ruthenium, osmium or iron. Metallocenes also can have an eclipsed conformation, as shown in FIG. 2B. As used herein, molecular formulae are not intended to depict a particular metallocene conformation.

The invention relates to Group 8 (VIII) asymmetric metallocenes of the general formula CpMCp', where M is Ru, Os or Fe. Cyclopentadienyl and indenyl moieties are abbreviated herein as Cp. In one example, both Cp and Cp' are cyclopentadienyl moieties. In another example, both Cp and Cp' are indenyl moieties. In yet another example, one of Cp and Cp' is cyclopentadienyl, while the other is indenyl.

In each of the Cp and Cp' moiety of the compounds of the invention, at least one hydrogen (H) atom is replaced by a substituent group, e.g. $D_1$ and $D_1'$.

The two groups, $D_1$ and $D_1'$, are different from each other and are independently selected.

$D_1$ can be:

X;

$C_{a1}H_{b1}X_{c1}$;

$C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom, e.g., fluorine (F), chlorine (Cl), bromine (Br) or iodine (I); or $NO_2$;

a1 is an integer from 2 to 8;

b1 is an integer from 0 to 2(a1)+1−c1 c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

$D_1'$ can be:

X;

$C_{a1}H_{b1}X_{c1}$;

$C_{a2}H_{b2}X_{c2}(C=O)C_{a1}H_{b1}X_{c1}$; or $C_{a2}H_{b2}X_{c2}OC_{a1}H_{b1}X_{c1}$, where X is a halogen atom, e.g., F, Cl, Br or I; or $NO_2$;

a1 is an integer from 1 to 8;

b1 is an integer from 0 to 2(a1)+1−c1;

c1 is an integer from 0 to 2(a1)+1−b1;

b1+c1 is at least 1;

a2 is an integer from 0 to 8;

b2 is an integer from 0 to 2(a2)+1−c2;

c2 is an integer from 0 to 2(a2)+1−b2.

As used herein, integer ranges are inclusive. Straight as well as branched substituent groups $D_1$ and $D_1'$ can be employed. For example, $D_1$ and/or $D_1'$ can be a straight or branched C1–C8 alkyl group.

In one embodiment of the invention, $D_1$ is selected from the following:

$C_{a1}H_{b1}X_{c1}$;

$C_{a2}H_{b2}X_{c2}(C=O)C_{a1}H_{b1}X_{c1}$; or $C_{a2}H_{b2}X_{c2}OC_{a1}H_{b1}X_{c1}$, where:

X is a halogen atom, e.g., F, Cl, Br or I;

a1 is an integer from 1 to 8;

b1 is an integer from 0 to 2(a1)+1−c1;

c1 is an integer from 0 to 2(a1)+1−b1;

b1+c1 is equal to or greater than 1;

a2 is an integer from 0 to 8;

b2 is an integer from 0 to 2(a2)+1−c2;

c2 is an integer from 0 to 2(a2)+1−b2;

b2+c2 is equal to or greater than 1;

and $D_1'$ is selected from the following:

$C_{a1}H_{b1}X_{c1}$, $C_{a2}H_{b2}X_{c2}(C=O)C_{a1}H_{b1}X_{c1}$, or $C_{a2}H_{b2}X_{c2}OC_{a1}H_{b1}X_{c1}$, where, X is a halogen atom, e.g., F, Cl, Br or I;

a1 is an integer from 1 to 8;

b1 is an integer from 0 to 2(a1)+1−c1 c1 is an integer from 0 to 2(a1)+1−b1 b1+c1 is equal to or greater than 1 a2 is an integer from 0 to 8 b2 is an integer from 0 to 2(a2)+1−c2 c2 is an integer from 0 to 2(a2)+1−b2 b2+c2 is equal to or greater than 1.

In another embodiment, $D_1$ is a halogen atom, X, e.g., F, Cl, Br, I; or $NO_2$ and $D_1'$ is selected from:

$C_{a1}H_{b1}X_{c1}$, $C_{a2}H_{b2}X_{c2}(C=O)C_{a1}H_{b1}X_{c1}$, or $C_{a2}H_{b2}X_{c2}OC_{a1}H_{b1}X_{c1}$, where, X is a halogen atom, e.g., F, Cl, Br, I; or $NO_2$;

a1 is an integer from 2 to 8;

b1 is an integer from 0 to 2(a1)+1−c1 c1 is an integer from 0 to 2(a1)+1−b1 b1+c1 is equal to or greater than 1 a2 is an integer from 0 to 8 b2 is an integer from 0 to 2(a2)+1−c2 c2 is an integer from 0 to 2(a2)+1−b2 b2+c2 is equal to or greater than 1.

Figure 3:
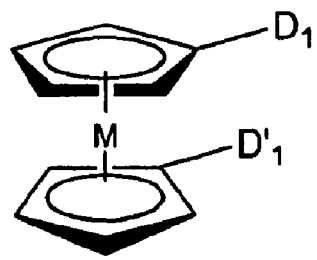
FIG. 3 shows a structural formula of a disubstituted asymmetric metallocene compound of the invention.

One example of the structural formula of a metallocene compound (CpMCp') of the invention is shown in FIG. 3.

Optionally, either or both Cp and Cp' moieties of the metallocene compounds of the invention further include one or more additional substituent group, $D_x$. In one example, at least one of Cp and Cp' is a multi-substituted cyclopentadienyl or indenyl moiety.

Figure 4:
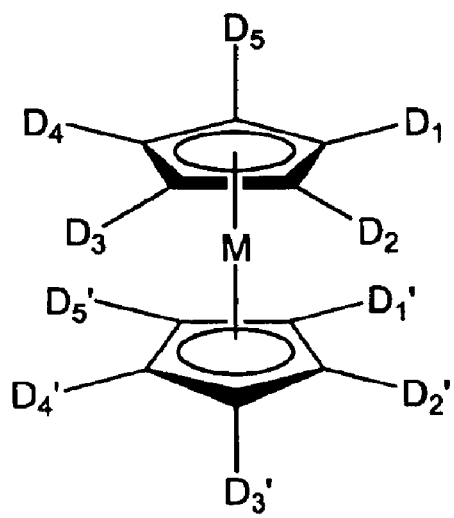
FIG. 4 shows a generalized structural formula of a metallocene compound of the invention.

A generalized structural formula of a CpMCp' metallocene compound of the invention is shown in FIG. 4. $D_1$ and $D_1'$ are independently selected as described above. $D_2$, $D_3$, $D_4$, $D_5$, $D_2'$, $D_3'$, $D_4'$, and $D_5'$ are independently selected from:

X, $C_{a1}H_{b1}X_{c1}$, $C_{a2}H_{b2}X_{c2}(C=O)C_{a1}H_{b1}X_{c1}$, $C_{a2}H_{b2}X_{c2}OC_{a1}H_{b1}X_{c1}$, $C_{a2}H_{b2}X_{c2}(C=O)OC_{a1}H_{b1}X_{c1}$, or $C_{a2}H_{b2}X_{c2}O(C=O)C_{a1}H_{b1}X_{c1}$ where, X is a halogen atom, e.g., F, Cl, Br, I; or $NO_2$;

a1 is an integer from 0 to 8 b1 is an integer from 0 to 2(a1)+1−c1 c1 is an integer from 0 to 2(a1)+1−b1 b1+c1 is greater to or equal to 1 a2 is an integer from 0 to 8 b2 is an integer from 0 to 2(a2)+1−c2 c2 is an integer from 0 to 2(a2)+1−b2 b2+c2 is greater to or equal to 1

Figure 5:
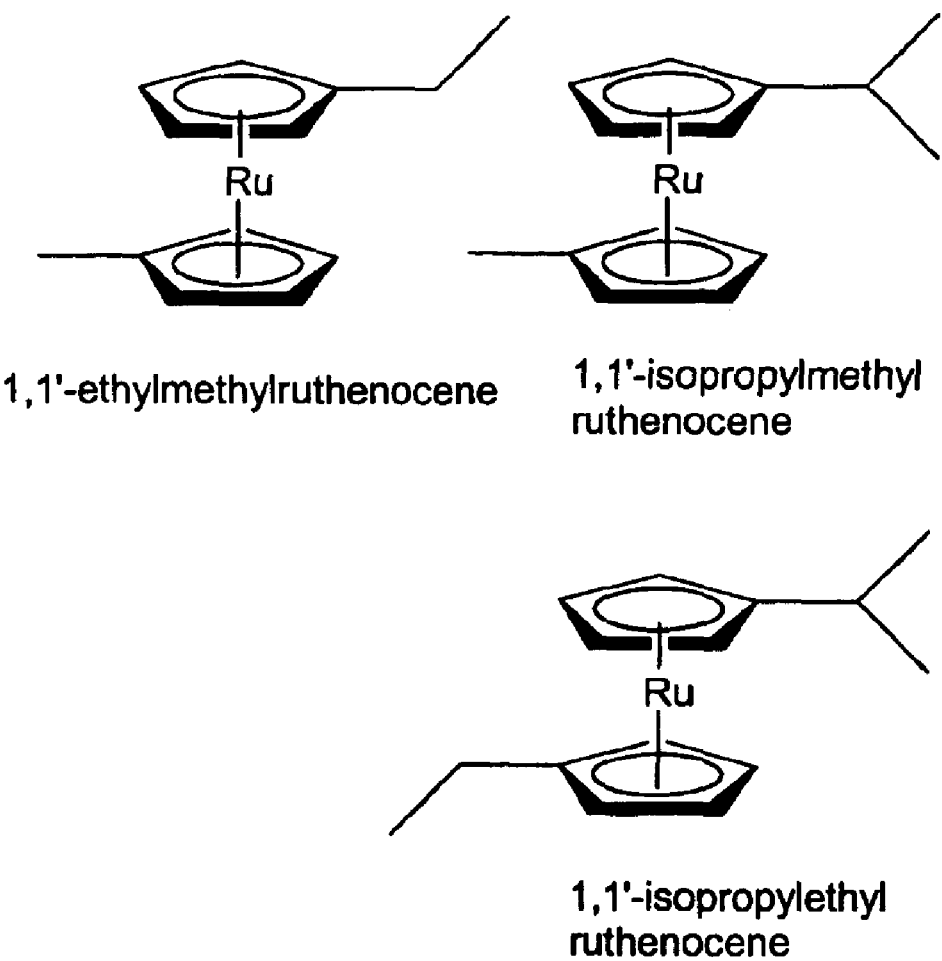
FIG. 5 shows illustrative asymmetric ruthenocene compounds of the invention.

Specific examples of ruthenium-based metallocene compounds of the invention are shown in Table 1 and in FIG. 5.

TABLE 1

| | |
|---|---|
| 1-methyl,1'-ethylruthenocene | 1,2-dimethyl,1'-ethylruthenocene |
| 1-methyl,1'-propylruthenocene | 1-methyl,1',3-diethylruthenocene |
| 1-methyl,1'-isopropylruthenocene | 1-methyl,1',2-diethylruthenocene |
| 1-methyl,1'-butylruthenocene | 1-methyl,1'-ethyl,3-propylruthenocene |
| 1-methyl,1'-secbutylruthenocene | 1-methyl,1'-propyl,3-ethylruthenocene |
| 1-methyl,1'-tertbutylruthenocene | 1-ethyl,1'-methyl,3-propylruthenocene |
| 1-ethyl,1'-propylruthenocene | 1-methyl,1'-ethyl,2-propylruthenocene |
| 1-ethyl,1'-isopropylruthenocene | 1-methyl,1'-propyl,2-ethylruthenocene |
| 1-ethyl,1'-butylruthenocene | 1-ethyl,1'-methyl,2-propylruthenocene |
| 1-ethyl,1'-secbutylruthenocene | 1-methyl,1'-propylruthenocene |
| 1-ethyl,1'-tertbutylruthenocene | 1-methyl-1'-ethylruthenocene |
| 1-propyl,1'-isopropylruthenocene | 1,3-dimethyl-1'-ethylruthenocene |
| 1-propyl,1'-butylruthenocene | 1,2,1'-dmethyl-3'-ethylruthenocene |
| 1-propyl,1'-secbutylruthenocene | 1-butyl-1'-acetylruthenocene |
| 1-propyl,1'-tertbutylruthenocene | 1-ethyl-1'-methoxyruthenocene |
| 1-isopropyl,1'-butylruthenocene | 1-ethyl-1'-methoxy-2-ethoxyruthenocene |
| 1-isopropyl,1'-secbutylruthenocene | 1,2,3,4-tetramethyl-1'-ethylruthenocene |
| 1-isopropyl,1'-tertbutylruthenocene | 1-acetyl,1'-ethoxyruthenocene |
| 1-butyl,1'-secbutylruthenocene | 1-difluoromethyl-1'-ethylruthenocene |
| 1-butyl,1'-tertbutylruthenocene | 1-trifluoromethyl,2,3,4-fluoro-1'-triflouromethylruthenocene |
| 1-secbutylruthenocene,1'-tertbutylruthenocene | 1-ethenyl-1'-fluororuthenocene |
| 1,1',3-trimethylruthenocene | 1-ethoxymethyl-1',2'-diethylruthenocene |
| 1,1',2-trimethylruthenocene | 1-ethyl,1'-propoxyruthenocene |
| 1,3-dimethyl,1'-ethylruthenocene | 1,1',2,4-triethyl-3'-acetylruthenocene |

Figure 6:
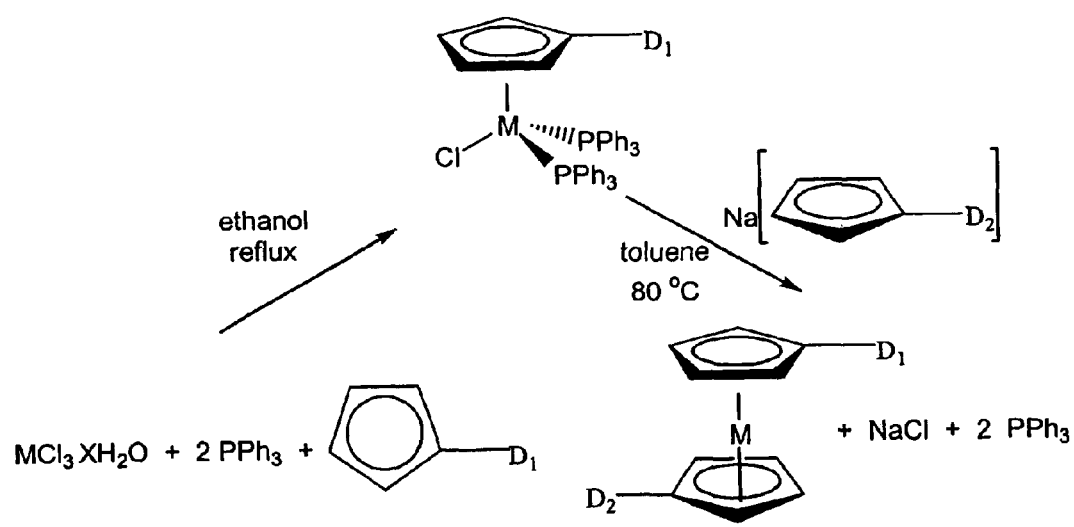
FIG. 6 shows a synthetic method that can be employed to form a metallocene compound of the invention.

The metallocene compounds of the invention also include osmium-based and iron-based compounds similar to those shown in Table 1 or FIG. 6.

A suitable synthetic method for preparing metallocene compounds of the invention is disclosed in U.S. patent application Ser. No. 10/685,777, by David M. Thompson and Cynthia A. Hoover with the title *Methods for Making Metallocene Compounds*, filed concurrently herewith, the entire teachings of which are incorporated herein by reference.

The method includes the steps of combining a metal salt compound, a ligand (L) compound and a first Cp compound, for example a substituted cyclopentadiene (HCp), to form an intermediate compound; and reacting the intermediate compound with a second (Cp') compound, for instance, a compound including a cyclopentadienyl anion, such as a cyclopentadienide salt, to form CpMCp'.

The metal salt can be a metal (III) salt, such as, for example, a metal halide (e.g., chloride, bromide, iodide, fluoride), a metal nitrate and other suitable metal salts. M is a Group 8 (VIII) metal, e.g., Ru, Os or Fe. Generally, the metal salt is abbreviated as $MX_n$. As used herein, the abbreviation $MX_n$ does not exclude metal salt compounds that include water of hydration and that, as known in the art, can be more specifically represented by the formula $MX_n \cdot \mu H_2O$, $\mu$ being other than 0. Thus in specific examples, the abbreviation $FeX_3$ used herein includes anhydrous as well as hydrated iron salts that can be employed to form ferrocenes or ferrocene-like compounds.

Ligand (L) generally is an electron pair donor compound. A neutral electron pair donor, such as, for example, triphenylphosphine ($PPh_3$) is employed in one example. Tricyclohexylphosphine and other phosphines of the general formula $PR_3$, as well as phosphite triesters, $P(OR)_3$, where R is phenyl, cyclohexyl, alkyl or branched alkyl, e.g., t-butyl, group, also can be employed. Other suitable electron pair donors include amines, phosphates, carbonyl compounds, olefins, polyolefins, chelating phosphines, chelating amines and others.

The Cp compound is a precursor of the Cp moiety in the CpMCp' compound described above. Preferably the Cp compound is HCp, e.g., cyclopentadiene or indene. The Cp compound also can be a salt of a cyclopentadienyl or indenyl anion, e.g., potassium cyclopentadienyl (KCp), sodium cyclopentadienyl (NaCp), lithium cyclopentadienyl (LiCp) and others. Suitable cations for use with a cyclopentadienyl anion in the synthetic method described herein include trimethylsilyl (TMS), Na, Li, K, Mg, Ca and Tl.

At least one hydrogen atom in the Cp moiety is replaced by a group $D_1$, as described above. Specific examples of HCp include, methylcyclopentadiene, ethylcyclopentadiene, n-propyl- or isopropylcyclopentadiene, n-butyl-, sec-butyl- or tert-butylcyclopentadiene, halo-cyclopentadiene and others.

The Cp compound also can be di- or multi-substituted, e.g., it can be a di-, tri-, tetra- and penta-substituted-cyclopentadiene. Specific examples of substituent groups $D_2$, $D_3$, $D_4$ and $D_5$ are described above.

Each of the $MX_n$, L and HCp components can be provided in neat form or can optionally include a suitable solvent. Preferred solvents that can be employed in the method of the invention include alcohols, such as, for instance, ethanol, methanol, isopropanol and other alcohols. Ethyl acetate, tetrahydrofuran (THF), saturated or unsaturated hydrocarbons, aromatic heterocycles, alkyl halides, silylated hydrocarbons, ethers, polyethers thioethers, esters, lactones, amides, amines, polyamines, nitriles, silicone oils and other aprotic solvents also can be employed. Combinations of solvents also can be employed.

Generally, concentrations of $MX_n$, L and Cp are selected as known in the art. For example, the molar concentration of $MX_n$ in a suitable solvent can be in the range of from about 0.1 M to neat. That of L in a suitable solvent can be in the range of from about 0.1 M to neat. The molar concentration of Cp in a suitable solvent can be in the range of from about 0.1 to neat. If neat phosphine is employed it is believed that the reaction would be highly exothermic. Methods and systems for dissipating substantial amounts of heat of reaction per unit volume are known in the art.

The three components can be combined in any order. In one example, the metal component and the HCp component are added concurrently to the L component. In another embodiment, the metal component and the HCp component are combined to form a mixture and then the mixture is combined with the L component, for instance by adding the L component to the mixture. In yet another embodiment, all components are combined at the same time.

Typically the molar ratio of HCp to $MX_n$ used is in the range from about 50 to about 1, preferably from about 12 to about 2 and most preferably in the range from about 7 to about 5. Typically, the molar ratio of L to $MX_n$ is in the range of from about 8 to about 0, preferably from about 6 to about 2 and most preferably from about 5 to about 3.5. If a large excess amount of HCp component is employed, the reaction is driven to forming $(Cp)_2M$ product.

The reaction temperature preferably is around the boiling point of the solvent employed or the boiling point of the reaction mixture. Other suitable temperatures can be determined by routine experimentation. Generally, the reaction can be conducted at a temperature that is in the range of from above the freezing point to about the boiling point of the reaction composition. For instance, the reaction can be conducted at a temperature in the range of from about $-100°$ C. to about $150°$ C.

The time of reaction generally depends on temperature, and concentration of the various reactants, and can range, for example, from about 5 minutes to about 96 hours.

The intermediate component formed by the reaction of the metal salt ($MX_n$) component, ligand (L) component and HCp can be represented by the formula $CpML_fX$, where $f=1$ or 2.

In one example, $CpML_fX$ is isolated, e.g., as a solid, by methods known in the art, such as filtration, centrifugation or recrystallization. Intermediate compound, $CpML_fX$, is then reacted with a Cp' compound, preferably in the presence of a solvent. Cp' preferably is an anion of the Cp' moiety in the compounds of the invention described above. Counter ions can include trimethylsilyl (TMS), Na, Li, K, Mg, Ca, Tl. Specific examples of cyclopentadienyl compounds that can be used include, but are not limited to sodium or lithium ethylcyclopentadienide, sodium or lithium methylcyclopentadienide, sodium or lithium isopropylcyclopentadienide and others. Di- or multi-substituted anions of the Cp' moiety also can be employed (e.g., di-, tri-, tetra- or penta-substituted cyclopentadienyl anions). Anions of unsubstituted indenes also can be employed, as described above.

In a specific example, the intermediate compound is $CpRu(PPh_3)_2Cl$. It is reacted with a salt of Cp'. Recommended salts of Cp' include NaCp', LiCp', $(Cp')_2Mg$, TMS (Cp') and (Cp')Tl.

Examples of suitable solvents include benzene, toluene, xylenes, pentanes, hexanes, petroleum ether, aromatic heterocycles, saturated or unsaturated hydrocarbons, alkyl halides, silylated hydrocarbons, ethers, polyethers, thioethers, esters, lactones, amides, amines, polyamines, nitrites, silicones, and others.

Generally, the molar concentrations of the Cp' component in a solvent can be in the range of from about 0.1 M to about 3.5 M, preferably in the range of from about 0.5 M to about 2.5 M and most preferably in the range of from about 1.4 to about 1.8 M.

Typically, the molar ratio of Cp' relative to the $CpML_fX$ is in the range from about 50 to about 1, preferably from about 6 to about 1 and most preferably from about 1.6 to about 1.2.

In another example the intermediate $CpML_fX$ component is not isolated. Following its formation in solution, a Cp' compound, such as described above, is added to the solution that includes $CpML_fX$.

The reaction between Cp' and the intermediate $CpML_fX$ (whether isolated or not) is conducted at a temperature such as generally described above and results in the formation of CpMCp' product.

The time of reaction generally depends on temperature, and concentration of the various reactants, and can range from about 15 minutes to about 6 days.

The product of the reaction, CpMCp', can be isolated and/or or purified by methods known in the art, such as, for example, solvent, e.g., hexane, extraction followed by distillation, sublimation or chromatography or directly by distillation, sublimation or chromatography. Recrystallization, ultracentrifugation and other techniques also can be employed. Alternatively, the product can be further employed in the reaction mixture, without further isolation and or purification.

A method for forming the compounds of the invention is described by the chemical reaction shown in FIG. 6. In the method depicted in FIG. 6, $MCl_3 \cdot XH_2O$, triphenylphosphine and a cyclopentadiene react in ethanol, under reflux, to form intermediate compound $CpM(PPh_3)_2Cl$, which then reacts with a sodium ethylcyclopentadienide to form CpMCp'.

Either or both Cp and/or Cp' can include additional substituent groups, $D_x$, such as, for instance, groups described above. Thus either or both Cp and/or Cp' can be a di-, tri-, tetra- or penta-substituted cyclopentadiene moiety.

In general, asymmetric ruthenocenes can be prepared by first preparing an intermediate of $CpRu(PPh_3)_2Cl$, followed by the reaction of this intermediate with a salt of Cp'. The most highly recommended salts of Cp' include NaCp', LiCp', $(Cp')_2Mg$, TMS(Cp') and (Cp')Tl. When trying to synthesize structures of the type CpRuCp' and when one of Cp or Cp' contains a ketone, ester or ether functionality it is preferred that the ring with the greater number of ketones, esters or ethers is identified as the Cp' ring, and that it is added to the intermediate as a TMS salt.

Figure 7:
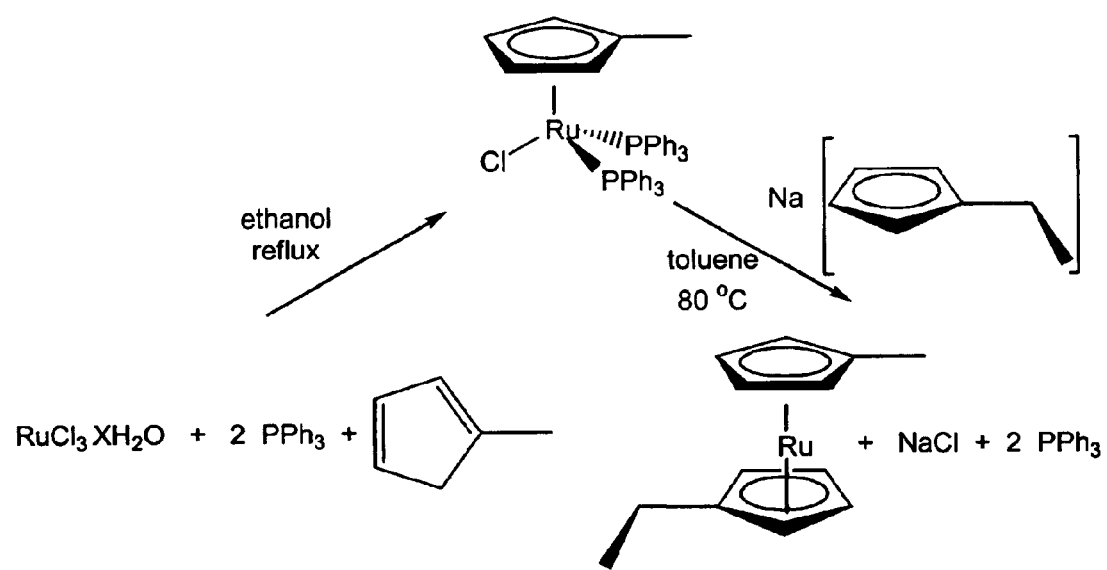
FIG. 7 shows a synthetic method for forming 1-methyl-1'-ethylruthenocene.

A synthetic scheme that can be employed to form a specific di-substituted asymmetric ruthenocene, i.e., 1-methyl,1'-ethylruthenocene or (methyl-cycplopentadienyl)(ethylcyclopentadienyl)ruthenium, is shown in FIG. 7. As shown in FIG. 7, $RuCl_3 \cdot XH_2O$, triphenylphosphine and methylcyclopentadiene react in ethanol, under reflux, to form intermediate compound chloro (methylcyclopentadienyl)bis(triphenylphosphine)ruthenium (II) or $(\eta^5-C_5H_4C_2H_5)Ru(PPh_3)_2Cl$, which then reacts with a sodium ethylcyclopentadienide to form 1-methyl,1'-ethylruthenocene.

Examples of techniques that can be employed to characterize the compounds formed by the synthetic methods described above include, but are not limited to, analytical gas chromatography, nuclear magnetic resonance (NMR), thermogravimetric analysis (TGA), inductively coupled plasma mass spectrometry (ICPMS), vapor pressure and viscosity measurements.

Without being held to a particular mechanism to interpret the invention, it is believed that specific functionalization of each of the Cp and Cp' rings modifies properties such as solubility, vapor pressure, decomposition, combustion and other reaction pathways, reduction/oxidation potentials, geometry, preferred orientations and electron density distribution. For example, it is believed that larger substituent $D_1$ and/or $D_1'$ contribute to an increase in molecular entropy and that metallocene compounds of the invention are more likely to be liquid at room temperature in comparison to previously disclosed compounds.

The asymmetric metallocenes of the invention are believed to be useful in scientific research, for example, in the study and understanding of organometallic chemistry of ferrocene and ferrocene-like molecules and in chemical reactions.

It is believed that the compounds of the invention also can be employed as combustion modifiers for solid propellants. In some cases, functionalization of the parent ferrocene may prevent migration of the ferrocene from the rubber like binder matrix of the solid propellant into the surrounding insulation material.

The metallocene compounds of the invention may find uses as catalysis, for instance, in zeolite-impregnated metallocene catalysts for the reduction of nitrogen oxides or as catalysts in chiral organic synthesis.

It is believed that the compounds of the invention may also find uses as iron deficiency supplements for animals and plants; antioxidants and antiknock agents; additives for motor fuels and oils; color pigments; radiation absorberes; and as insecticides and fungicides.

The asymmetric metallocenes of the invention are particularly useful as precursors in processes for forming films, coatings or powders, particularly in film deposition processes, such as CVD processes. Such processes are described in the U.S. patent application Ser. No. 10/685,785 by David M. Thompson and Cynthia A. Hoover, John Peck and Mike Litwin, entitled *Deposition Processes Using Group 8 (VIII) Metallocene Precursors*, filed concurrently herewith, the entire teachings of which are incorporated herein by reference.

EXEMPLIFICATION

Example 1

Step A

A 5 L five-necked round bottomed flask was equipped with a mechanical stirring paddle through the central neck. It was then charged with ethanol (2.0 L) and PPh3 (420 g, 1.6 mol). Two 500 mL three necked flasks, were connected to two necks of the 5 L four-necked flask via Teflon® (perfluorinated polymer, DuPont Corp.) tubing through positive displacement pumps. The remaining neck of the 5 L flask was equipped with a condenser. A heating mantle was placed beneath the 5 L flask and the solution was stirred and heated to reflux. At reflux all of the triphenylphosphine dissolved in the ethanol. The system was purged with nitrogen for 30 minutes while at reflux.

While this was taking place one of the 500 mL round-bottomed flasks was charged with $RuCl_3 \cdot XH_2O$ (100 g, 0.40 mol), ethanol (300 mL) and a Teflon® (perfluorinated polymer, DuPont Corp.) coated magnetic stirring bar. The ethanolic solution immediately developed a brown/orange colour. To dissolve all of the $RuCl_3 \cdot XH_2O$ it was necessary to heat the solution. This solution was sparged with nitrogen for 30 minutes by inserting a needle connected to a 1–2 pounds per square inch gauge (psig) nitrogen source through the septum and into the solution and by piercing the septum with another needle to allow for relief of excess pressure.

An acetonitrile/dry ice bath was made up and the other 500 mL flask was immersed into this bath. Freshly distilled methylcyclopentadiene (190 g, 270 mL, 2.4 mol, freshly distilled under a nitrogen atmosphere) was then cannulated into the cooled flask.

After the nitrogen sparging of the ethanolic solutions of triphenylphosphine and ruthenium trichloride had completed, the contents of the two 500 mL flasks were pumped into the 5.0 L flask by positive displacement pumps at independent rates so that both additions completed after 5 minutes. To accomplish this the ethylcyclopentadiene was pumped in at a rate of 45 mL/min and the ethanolic ruthenium trichloride was pumped in at a rate of 50 mL/min.

After the addition had been completed the solution was left to reflux for an additional 2 hours. During this time small orange crystals could be seen accumulating above the meniscus of the solution on the walls of the 2 L flask.

Step B

The two positive displacement pumps and Teflon® (perfluorinated polymer, DuPont Corp.) lines were disconnected from the 5 L flask after the 2 hours of stirring. A distillation sidearm was connected one of the necks of the flask and approximately 1 L of ethanol was removed via distillation. Mechanical stirring was discontinued and the orange crystals settled to the bottom of the flask. The solution cooled to room temperature over 3 hours. The solution was then removed from the flask by inserting a piece of glass tubing with a coarse frit attached to the end of it and using reduced pressure to draw the solution through the frit and out of the flask. The crystals were washed with heptane (300 mL) and the heptane was removed in a similar fashion. The washing was carried out three times.

Step C

All of the open ports to the flask were sealed with rubber septa and the flask was evacuated and refilled with nitrogen three times. THF (500 mL, anhydrous) was cannulated into the flask and mechanical stirring was initiated. A THF solution of lithium ethylcyclopentadiene (500 mL, 1.2 M, 0.60 mol) was then cannnulated into the 5 L flask. The contents were heated to reflux and stirred for 4 hours.

After the 4 hours of reflux, stirring was discontinued and the solution was transferred to a 2 L one necked round bottomed flask. This solution was concentrated to a volume of approximately 200 mL on a rotary evaporator. The viscous liquid was then transferred to a 250 mL round bottomed flask.

The 250 mL round-bottomed flask was fitted with a short path distillation adapter with vigreux indentations and a 100 mL storage flask receptacle. The liquid was distilled under vacuum and a clear yellow liquid, 1-methyl,1'-ethylruthenocene containing some triphenylphosphine (determined by GCMS). Spinning band distillation of the yellow liquid afforded 84.6 g (82% yield) of triphenylphosphine free 1-methyl,1'-ethylruthenocene in >99% purity (GCMS, 1H NMR), with the remaining impurities being attributable to 1,1'-dimethylruthenocene and 1,1'-diethylruthenocene. TGA studies showed that this liquid had less than 0.01% nonvolatile residue.

Example 2

A 2 L three-necked round bottomed flask was charged with a Teflon® (perfluorinated polymer, DuPont Corp.) stirring bar, ethanol (1.0 L) and $PPh_3$ (263 g, 1.0 mol, 5 eq). A 250 mL dropping funnel, a 150 mL bath-jacketed dropping funnel, and a condenser were attached to the three necks of the 2 L flask. It is important to note that both dropping funnels were equipped with Teflon® (perfluorinated polymer, DuPont Corp.) valves that permitted their isolation from the atmosphere of the round-bottomed flask. A rubber septum was connected to the top of the 150 mL bath-jacketed dropping funnel. The top of the condenser was fitted with an T junction adapter and connected to an inert atmosphere. A heating mantle was placed beneath the 2 L three-necked round-bottomed flask and the solution was stirred and heated to reflux. At reflux all of the triphenylphosphine dissolved in the ethanol. The system was purged with nitrogen for 3 hours while at reflux.

While this was taking place a 500 mL Erlenmyer flask was charged with $RuCl_3 \cdot XH_2O$ (50 g, 0.20 mol), ethanol (150 mL, 1 eq) and a Teflon® (perfluorinated polymer, DuPont Corp.) coated magnetic stirring bar. The ethanolic solution immediately developed a brown/orange colour. To dissolve all of the $RuCl_3 \cdot XH_2O$ it was necessary to gently heat the solution. This solution was poured into the 250 mL dropping funnel and the dropping funnel was fitted with a rubber septum. This solution was sparged with nitrogen for 30 minutes by inserting a needle connected to a 1–2 psig nitrogen source through the septum and into the solution and by piercing the septum with another needle to allow for relief of excess pressure.

A methanol/dry ice bath was made up in the 150 mL bath-jacketed dropping funnel. The interior of this dropping funnel was purged with nitrogen for 30 minutes in a similar fashion to which the other dropping funnel was sparged. Methylcyclopentadiene (96.2 g, 1.2 mol, 6 eq, doubly distilled under a nitrogen atmosphere) was then cannulated into the cooled dropping funnel through the rubber septum.

After the 3 hours of purging the 2 L-round bottomed flask had elapsed, the Teflon® (perfluorinated polymer, DuPont Corp.) valves isolating the dropping funnels from the rest of the system were both opened and dropwise addition of the two solutions commenced simultaneously. Over the course of 20 minutes the two solutions were both added to the ethanolic $PPh_3$ solution. During this entire time the solution was at reflux. The solution quickly developed a deep orange brown color. After the addition had been completed the solution was left to reflux for an additional 2 hours. During this time small orange crystals of $CpRu(PPh_3)_2Cl$ could be seen accumulating above the meniscus of the solution on the walls of the 2 L flask.

A piece of tubing with a coarse porous frit attached to one end was attached to a positive displacement pump. The fritted end of the tubing was immersed in the reactor and all of the liquids were pumped out of the 2 L round-bottomed flask. At this stage the dropping funnels were removed from the reactor. One side was fitted with a K-Head distillation adapter and the other side was fitted with a rubber septum. The flask was evacuated and refilled with nitrogen three times. Working under nitrogen, anhydrous toluene (1.0 L) was cannulated into the 5 L flask through the rubber septum. The dark opaque solution was heated to reflux and the K-head distillation adapter was opened to distill off a fraction of the solvent. Distillate was collected until the head temperature reached 109° C. (It is important to note that in different experiments this consumes different volumes of solvent—typically 400–600 mL of liquid). The solution was then cooled to below reflux.

The flask was then charged with additional toluene to obtain a volume of approximately 600 mL toluene. A lithium ethylcyclopentadienide slurry of toluene (35 g, 0.35 mol, 400 mL) was then cannulated into the reaction pot. Following this addition the solution was stirred for 4 hours at 80° C. At this stage the flask was removed from the glovebox and the majority of toluene was removed using a K-head distillation adapter.

The remaining liquid (approximately 400 mL) was decanted into a 1.0 L round-bottomed flask. This round-bottomed flask was fitted with a short path distillation adapter with vigreux indentations and distilled. The liquid collected from the vigreux column was distilled again using spinning band distillation under vacuum and 44 g of a clear yellow liquid, 1-methyl,1'-ethylruthenocene was obtained in >99% purity (GCMS). TGA studies showed that this liquid had less than 0.01% nonvolatile residue.

Example 3

Lithium(ethylcyclopentadienide) was produced as follows. A 2 L three-necked jacketed round bottomed flask was charged with a Teflon® (perfluorinated polymer, DuPont Corp.) stirring bar. A stopcock adapter, a thermowell adapter with thermowell and a rubber septum were fitted to the three necks of the flask. A nitrogen/vacuum manifold was connected to the stopcock adapter and the flask was evacuated and refilled with nitrogen 3 times. Anhydrous toluene (1.0 L) was then cannulated into the flask through the rubber septum and stirring was initiated. A cold fluid circulator was connected to the outer jacket of the jacketed flask with nalgene tubing and a cold fluid (−15° C.) was circulated through the outside wall of the jacketed flask. Once the toluene reached −10° C., freshly distilled ethylcyclopentadiene (middle cut distilled on a vigreux column) was cannulated into the flask (127 g, 1.35 mol). While stirring, n-butyllithium (800 mL, 1.6 M in hexanes, 1.28 mol) was slowly cannulated at a rate that kept the temperature below 0° C. (approximately 2 hours). During the addition of the n-butyllithium a fine white precipitate (lithium ethylcyclopentadienide) became evident in the solution.

This material could be used as a suspension or isolated as a solid via filtration and removal of solvent.

Example 4

In a nitrogen glovebox, a 250 mL flask was charged with THF (50 mL, anhydrous, inhibitor free), chloro(ethylcyclopentadienyl)bis(triphenylphosphine)ruthenium (II) (3.22 g, 0.004 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 30 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 301 g/mol was observed consistent with the 1-ethyl-1'-isopropylruthenocene. Other peaks with masses consistent with the presence of alkylcyclopentadiene dimers, 1,1'-diethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (0.72 g). This liquid was then purified via chromatography. A silica gel in pentane solution was used. The column had a diameter of 0.75" and a 6" length. 0.53 g of 99+% pure 1-ethyl-1'-isopropylruthenocene were isolated via chromatography (41% yield).

Example 5

In a nitrogen glovebox, a 250 mL flask was charged with THF (50 mL, anhydrous, inhibitor free), chloro(methylcyclopentadienyl)bis(triphenylphosphine)ruthenium (II) (5.02 g, 0.007 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 50 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 287 g/mol was observed consistent with 1-methyl-1'-isopropylruthenocene. Other peaks with masses consistent with the presence of alkylcyclopentadiene dimers, 1,1'-dimethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (1.78 g). This liquid was then purified via chromatography. A silica gel in pentane solution was used. The column had a diameter of 0.75" and a 6" length. 1.03 g of 98+% pure 1-methyl-1'-isopropylruthenocene were obtained after chromatography (53% yield).

Example 6

In a nitrogen glovebox, a 250 mL flask was charged with bis(propylcyclopentadienyl)magnesium (5.15 g, 0.02 mol, 1 equivalent), chloro(methylcyclopentadienyl)bis(triphenylphosphine)ruthenium(II) (5.02 g, 0.007 mol, 1 equivalent) and a Teflon® (perfluorinated polymer, DuPont Corp.) stirring bar. Toluene (120 mL, anhydrous, inhibitor free) was cannulated into the 250 mL round-bottomed flask and the contents were stirred. Following the addition of solvent the solution developed a deep red color.

The toluene solvent was then removed from the flask under reduced pressure. The toluene solvent was removed under reduced pressure and the flask was fitted with a short path distillation adapter. The distillate was collected and the GC/MS revealed that the main cut from the short path distillation was 88.7% pure 1-propyl-1'-ethylruthenocene.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. An asymmetric Group 8 (VIII) metallocene of the general formula CpMCp',
where M is a metal selected from the group consisting of Ru, and Os;

Cp is a first substituted cyelopentadienyl or indenyl moiety that includes at least one substiutuent group $D_1$;

Cp' is a second substituted cyclopentadienyl or indenyl moiety that includes at least one substituent group $D_1'$;

wherein $D_1$ is different from $D_1'$;

$D_1$ is selected from the group consisting of:

X;

$C_{a1}H_{b1}X_{c1}$;

$C_{a2}H_{b2}X_{c2}(C=O)C_{a1}H_{b1}X_{c1}$; and $C_{a2}H_{b2}X_{c2}OC_{a1}H_{b1}X_{c1}$, where X is F, Cl, Br, I or $NO_2$;

a1 is an integer from 2 to 8;

b1 is an integer from 0 to 2(a1)+1−c1;

c1 is an integer from 0 to 2(a1)+1+1−b1;

b1+c1 is at least 1;

a2 is an integer from 0 to 8;

b2 is an integer from 0 to 2(a2)+1−c2;

c2 is an integer from 0 to 2(a2)+1−b2; and $D_1'$ is selected from the group consisting of:

X;

$C_{a1}H_{b1}X_{c1}$;

$C_{a2}H_{b2}X_{c2}(C=O)C_{a1}H_{b1}X_{c1}$; and $C_{a2}H_{b2}X_{c2}OC_{a1}H_{b1}X_{c1}$, where, X is Fl, Cl, Br, I or $NO_2$;

a1 is an integer from 0 to 8;

b1 is an integer from 0 to 2(a1)+1−C1;

c1 is an integer from 0 to 2(a1)+1−b1;

b1+c1 is equal to or greater than 1;

a2 is au integer from 0 to 8;

b2 is an integer from 0 to 2(a2)+1−c2;

c2 is an integer from 0 to 2(a2)+1−b2;

b2+c2 is greater to or equal to 1.

2. The asymmetric metallocene of claim 1 wherein either or both of Cp and Cp' includes at learn one additional substituent, $D_x$, selected from the group consisting of:

X;

$C_{a1}H_{b1}X_{c1}$;

$C_{a2}H_{b2}X_{c2}(C=O)C_{a1}H_{b1}X_{c1}$;

$C_{a2}H_{b2}X_{c2}OC_{a1}H_{b1}X_{c1}$;

$C_{a2}H_{b2}X_{c2}(C=O)OC_{a1}H_{b1}X_{c1}$; and $C_{a2}H_{b2}X_{c2}(C=O)C_{a1}H_{b1}X_{c1}$;

where,

X is Fl, Cl, Br, I or $NO_2$;

a1 is an integer from 0 to 8;

b1 is an integer from 0 to 2(a1)+1−C1;

c1 is an integer from 0 to 2(a1)+1−b1;

b1+c1 is equal to or greater than 1;

a2 is an integer from 0 to 8;

b2 is an integer from 0 to 2(a2)+1−c2; and c2 is an integer from 0 to 2(a2)+1−b2;

b2+c2 is greater to or equal to 1.

3. A metallocene compound represented by the following molecular formula:

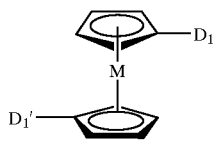

where

M is selected from the group consisting of Ru and Os;

$D_1$ is different $D_1'$ and $D_1$ and $D_1'$ are independently selected from the group consisting of:

X;

$C_{a1}H_{b1}X_{c1}$;

$C_{a2}H_{b2}X_{c2}(C=O)C_{a1}H_{b1}X_{c1}$; and $C_{a2}H_{b2}X_{c2}OC_{a1}H_{b1}X_{c1}$, where X is F, Cl, Br, I or $NO_2$;

a1 is an integer from 1to 8;

b1 is an integer from 0 to 2(a1)+1−c1;

c1 is an integer from 0 to 2(a1)+1+1−b1;

b1+c1 is at least 1;

a2 is an integer from 0 to 8;

b2 is an integer from 0 to 2(a2)+1−c2; and c2 is an integer from 0 to 2(a2)+1−b2.

4. The metallocene compound of claim 3, wherein $D_1$ is methyl and $D_1'$ is selected from the group consisting of ethyl, propyl, isopropyl, n-butyl, sec-butyl and tert-butyl.

5. The metallocene compound of claim 3, wherein $D_1$ is ethyl and $D_1'$ is selected from the group consisting of propyl, isopropyl, n-butyl, sec-butyl and tert-butyl.

6. The metallocene compound of claim 3, wherein D1 is propyl and D1' is selected from the group consisting of isopropyl, n-butyl, sec-butyl and tert-butyl.

7. The metallocene compound of claim 3, wherein $D_1$ is isopropyl and $D_1'$ is selected from the group consisting of n-butyl, sec-butyl and tert-butyl.

8. The metallocene compound of claim 3, wherein $D_1$ is n-butyl and $D_1$ is selected from the group consisting of sec-butyl and tert-butyl.

9. The metallocene compound of claim 3, wherein $D_1$ is sec-butyl and $D_1'$ is tert-butyl.

10. A compound of the general formula,

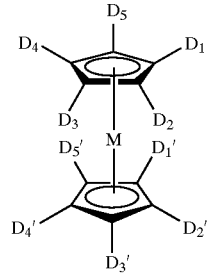

where

M is selected from the group consisting of Ru, Os and Fe;

$D_1$, $D_1'$ and $D_2$ are different and each is independently selected from the group consisting of:

X;

$C_{a1}H_{b1}X_{c1}$;

$C_{a2}H_{b2}X_{c2}(C=O)C_{a1}H_{b1}X_{c1}$; and $C_{a2}H_{b2}X_{c2}OC_{a1}H_{b1}X_{c1}$.

where

X is F, Cl Br or I or $NO_2$;

a1 is an integer from 1 to 8;

b1 is an integer from 0 to 2(a1)+1−c1;

c1 is an integer from 0 to 2(a1)+1−b1;

b1+c1 is equal to or greater than 1;

a2 is an integer from 0 to 8;

b2 is an integer from 0 to 2(a2)+1−c2;

c2 is an integer from 0 to 2(a2)+1−b2; and each of $D_3$, $D_4$, $D_5$, $D_2'$, $D_3'$, $D_4'$, and $D_5'$ is independently selected from the group consisting of:

X;

$C_{a1}H_{b1}X_{c1}$;

$C_{a2}H_{b2}X_{c2}(C=O)C_{a1}H_{b1}X_{c1}$;

$C_{a2}H_{b2}X_{c2}OC_{a1}H_{b1}X_{c1}$;

$C_{a2}H_{b2}X_{c2}(C=O)OC_{a1}H_{b1}X_{c1}$; and $C_{a2}H_{b2}X_{c2}O(C=O)C_{a1}H_{b1}X_{c1}$, where X is F, Cl Br or I or $NO_2$;

a1 is an integer from 1 to 8;

b1 is an integer from 0 to 2(a1)+1−c1;

c1 is an integer from 0 to 2(a1)+1−b1;

b1+c1 is equal to or greater than 1;

a2 is an integer from 0 to 8;

b2 is an integer from 0 to 2(a2)+1−c2;

c2 is an integer from 0 to 2(a2)+1−b2;

b2+c2 is equal to or greater than 1.

11. An asymmetric Group 8 (VIII) metallocene of the general formula CpMCp',
where
M is a metal selected from the group consisting of Ru, Os and Fe;
Cp is a first substituted cyclopentadienyl or indenyl moiety that includes at least one substituent group $D_1$;
Cp' is a second substituted cyclopentadienyl or indenyl moiety that includes at least one substituent group $D_1'$;
wherein
$D_1$ is different from $D_1'$;
$D_1$ and $D_1'$ are independently selected from the group consisting of:
X;
$C_{a1}H_{b1}$; and
$C_{a2}H_{b2}(C=O)C_{a1}H_{b1}$;
where
X is F, Cl, Br or I;
a1 is an integer from 1 to 4;
b1 is an integer 2(a1)+1;
a2 is an integer from 0 to 2; and
b2 is an integer 2(a2).

12. The asymmetric metallocene of claim 11 wherein either or both of Cp and Cp' includes at least one additional substiutuent, $D_2$, selected from the group consisting of:
X;
$C_{a1}H_{b1}$; and
$C_{a2}H_{b2}(C=O)C_{a1}H_{b1}$;
where
X is F, Cl, Br or I;
a1 is an integer from 0 to 4;
b1 is an integer 2(a1)+1;
a2 is an integer from 0 to 2; and
b2 is an integer 2(a2).

13. A metallocene compound represented by the following molecular formula:

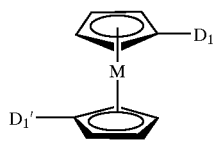

where
M is selected from the group consisting of Ru, Os and Fe;
$D_1$ and $D_1'$ are different and are independently selected from the group consisting of:
X;
$C_{a1}H_{b1}$; and
$C_{a2}H_{b2}(C=O)C_{a1}H_{b1}$;
where
X is F, Cl, Br or I;
a1 is an integer from 1 to 4;
b1 is an integer 2(a1)+1;
a2 is an integer from 0 to 2; and
b2 is an integer 2(a2).

14. The metallocene compound of claim 13, wherein $D_1$ is methyl and $D_1'$ is selected from the group consisting of ethyl, propyl, isopropyl, n-butyl, sec-butyl and tert-butyl.

15. The metallocene compound of claim 13, wherein $D_1$ is ethyl and $D_1'$ is selected from he group consisting of propyl, isopropyl, n-butyl, sec-butyl and tert-butyl.

16. The metallocene compound of claim 13, wherein $D_1$ is propyl and $D_1'$ is selected from rho group consisting of isopropyl, n-butyl, sec-butyl and tert-butyl.

17. The metallocene compound of claim 13, wherein $D_1$ is isopropyl and $D_1'$ is selected from the group consisting of n-butyl, sec-butyl and tert-butyl.

18. The metallocene compound of claim 13, wherein $D_1$ is n-butyl and $D_1'$ is selected from the group consisting of sec-butyl and tert-butyl.

19. The metallocene compound of claim 13, wherein $D_1$ is sec-butyl and $D_1'$ is tert-butyl.

20. A compound of the general formula,

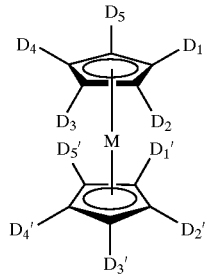

where
M is selected from the group consisting of Ru, Os and Fe;
$D_1$, $D_2$ and $D_1'$ are different and are independently selected from the group consisting of:
X;
$C_{a1}H_{b1}$; and
$C_{a2}H_{b2}(C=O)C_{a1}H_{b1}$;
where
X is F, Cl Br or I;
a1 is an integer from 1 to 4;
b1 is an integer 2(a1)+1;
a2 is an integer from 0 to 2; and
b2 is an integer from 2(a2); and
each of $D_2$, $D_3$, $D_4$, $D_5$, $D_2'$, $D_3'$, $D_4'$, and $D_5'$ is independently selected from the group consisting of:
X;
$C_{a1}H_{b1}$; and
$C_{a2}H_{b2}(C=O)C_{a1}H_{b1}$;
where
X is F, Cl Br or I;
a1 is an integer from 0 to 4;
b1 is an integer 2(a1)+1;
a2 is an integer from 0 to 2; and
b2 is an integer 2(a2).

21. The metallocene compound of claim 14 which comprises 1-ethyl-1'-methylruthenocene.

* * * * *